US007675389B2

(12) United States Patent
Yamakawa et al.

(10) Patent No.: US 7,675,389 B2
(45) Date of Patent: Mar. 9, 2010

(54) PIEZOELECTRIC RESONATOR, PIEZOELECTRIC FILTER, AND DUPLEXER AND COMMUNICATION DEVICE USING THE SAME

(75) Inventors: Takehiko Yamakawa, Osaka (JP); Hiroshi Nakatsuka, Osaka (JP); Keiji Onishi, Osaka (JP)

(73) Assignee: Panasonic Corporation, Osaka (JP)

( * ) Notice: Subject to any disclaimer, the term of this patent is extended or adjusted under 35 U.S.C. 154(b) by 153 days.

(21) Appl. No.: 11/916,792

(22) PCT Filed: Jun. 22, 2006

(86) PCT No.: PCT/JP2006/312488

§ 371 (c)(1),
(2), (4) Date: Dec. 6, 2007

(87) PCT Pub. No.: WO2007/000929

PCT Pub. Date: Jan. 4, 2007

(65) Prior Publication Data

US 2008/0290969 A1    Nov. 27, 2008

(30) Foreign Application Priority Data

Jun. 29, 2005    (JP) ................................ 2005-190290

(51) Int. Cl.
*H03H 9/70* (2006.01)
*H03H 9/15* (2006.01)
*H03H 9/54* (2006.01)

(52) U.S. Cl. ........................ 333/133; 333/187; 333/189; 310/312

(58) Field of Classification Search ......... 333/186–189, 333/200; 310/312, 321, 322, 324, 326
See application file for complete search history.

(56) References Cited

U.S. PATENT DOCUMENTS

| | | | | | |
|---|---|---|---|---|---|
| 4,562,370 | A | * | 12/1985 | Von Dach | 310/312 |
| 6,114,795 | A | * | 9/2000 | Tajima et al. | 310/312 |
| 6,262,637 | B1 | * | 7/2001 | Bradley et al. | 333/133 |
| 6,396,200 | B2 | | 5/2002 | Misu et al. | |
| 6,657,363 | B1 | | 12/2003 | Aigner | |
| 7,236,066 | B2 | * | 6/2007 | Ebuchi | 333/187 |
| 7,489,063 | B2 | * | 2/2009 | Isobe et al. | 310/312 |
| 2004/0017269 | A1 | | 1/2004 | Gotoh et al. | |

FOREIGN PATENT DOCUMENTS

EP    1 385 265    1/2004

(Continued)

OTHER PUBLICATIONS

International Search Report issued Sep. 26, 2006 in the International (PCT) Application of which the present application is the U.S. National Stage.

*Primary Examiner*—Barbara Summons
(74) *Attorney, Agent, or Firm*—Wenderoth, Lind & Ponack, L.L.P.

(57) ABSTRACT

Three or more piezoelectric resonators having resonance frequencies different from one another are realized on the same substrate. First through third frequency adjustment layers of first through third piezoelectric resonators, respectively, provided on the same substrate 101 are formed by varying, among the frequency adjustment layers, the ratio of area (depressions 109 and 110) to be etched to area not to be etched.

11 Claims, 9 Drawing Sheets

FOREIGN PATENT DOCUMENTS

| | | |
|---|---|---|
| JP | 3-293807 | 12/1991 |
| JP | 2002-515667 | 5/2002 |
| JP | 2002-359534 | 12/2002 |
| WO | 99/37023 | 7/1999 |
| WO | 99/59244 | 11/1999 |

* cited by examiner

- CAVITY CONTOUR
- DEPRESSION
- FREQUENCY ADJUSTMENT LAYER CONTOUR
- ELECTRODE CONTOUR

PIEZOELECTRIC RESONATOR, PIEZOELECTRIC FILTER, AND DUPLEXER AND COMMUNICATION DEVICE USING THE SAME

TECHNICAL FIELD

The present invention relates to a piezoelectric resonator, a piezoelectric filter, a duplexer, and a communication device, which are used for a wireless circuit of a mobile communication device terminal such as a mobile phone, a wireless LAN, and the like.

BACKGROUND ART

It is required to further reduce components built in an electronic device such as a mobile device, in size and weight. For example, it is required that a filter and a duplexer which are used for the mobile device be small in size, that the frequency characteristics thereof be precisely adjusted, and that the insertion loss thereof be small. As a filter for satisfying the above requirements, a piezoelectric filter using a piezoelectric resonator is known.

FIG. 11 is a cross-sectional view of a conventional piezoelectric resonator.

In FIG. 11, a first piezoelectric resonator 1101 and a second piezoelectric resonator 1102 are formed on the same substrate 1103. The first piezoelectric resonator 1101 is formed on a first cavity 1104 provided in the substrate 1103 and the second piezoelectric resonator 1102 is formed on a second cavity 1105 provided in the substrate 1103, in such a manner that a lower electrode layer 1106, a piezoelectric layer 1107, and an upper electrode layer 1108 are positioned in order starting from the bottom so as to cover the first cavity 1104 and the second cavity 1105. The upper electrode layer 1108 corresponding to the first piezoelectric resonator 1101 is processed to be thinner than the upper electrode layer 1108 corresponding to the second piezoelectric resonator 1102.

The first piezoelectric resonator 1101 and the second piezoelectric resonator 1102 function as a resonator by each applying an electrical field between the upper electrode layer 1108 and the lower electrode layer 1106, thereby polarizing and distorting the piezoelectric layer 1107 so as to produce mechanical resonance, and by electrically extracting the mechanical resonance. The resonance frequencies of the first piezoelectric resonator 1101 and the second piezoelectric resonator 1102 are mainly determined based on the film thicknesses and the mass loading effects of vibration sections including the upper electrode layer 1108, the piezoelectric layer 1107, and the lower electrode layer 1106. Thus, it is possible to set the resonance frequency of the first piezoelectric resonator 1101 to be higher than the resonance frequency of the second piezoelectric resonator 1102 by making the upper electrode layer 1108 corresponding to the first piezoelectric resonator 1101 thinner than the upper electrode layer 1108 corresponding to the second piezoelectric resonator 1102, as shown in FIG. 11.

Alternatively, a layer thickness adjustment method for setting the resonance frequency of the first piezoelectric resonator 1101 to be high may employ, instead of making the whole upper electrode layer 1108 corresponding to the first piezoelectric resonator 1101 thin as shown in FIG. 11, a method of making thin some portion thereof as a whole (FIG. 12) or a method of dividing a portion to be made thin into a plurality of portions (see Patent Document 1).

Note that in order to vary the thickness of a piezoelectric resonator by differentiating the laminate thicknesses of a layer as described above, ordinarily, a mask is designed to correspond to a portion to be removed or a portion to be left, so as to use a photolithography technique (see Patent Document 2). The photolithography technique as used herein refers to a technique for sequentially performing a process of resist coating, exposure using the mask, development, etching, and resist removal.

Patent Document 1: Published Japanese Translation of a PCT Application No. 2002-515667

Patent Document 2: Japanese Laid-Open Patent Publication No. 2002-359534

In the conventional structures shown in FIGS. 11 and 12, however, in order to form three or more piezoelectric resonators having resonance frequencies different from one another on the same substrate, it is required to design a plurality of masks different from one another for frequency adjustment and to perform the photolithography process twice or more. This is disadvantageous for manufacturing a device at lower cost.

Thus, the objects of the present invention are to manufacture a device at low cost and obtain a high yield of a device, by simplifying a process and reducing consumption of masks, resist and the like, so as to realize a high-Q piezoelectric resonator and consequently provide a low-loss piezoelectric filter.

SUMMARY OF THE INVENTION

The present invention is directed to a piezoelectric resonator. To achieve the above objects, the piezoelectric resonator according to the present invention includes: a substrate; vibration sections provided on the substrate; and frequency adjustment layers formed on the vibration sections in such a shape that in each of the frequency adjustment layers, adjustment material corresponding to a plurality of small-area figures (i.e., depressions or islands) is removed or the adjustment material other than that corresponding to a plurality of small-area figures is removed, and a mass per unit volume of the adjustment material not removed is larger in a peripheral portion than in a central portion. It is preferable that the mass per unit volume of the adjustment material of each of the frequency adjustment layers is incrementally larger moving from the central portion to the peripheral portion.

It is possible to realize a piezoelectric filter by connecting three or more piezoelectric resonators of this type in, for example, a ladder form. In this case, the average mass of the adjustment material varies among the frequency adjustment layers of the three or more piezoelectric resonators. Further, it is possible to construct a duplexer by using the filter for a transmission filter and a reception filter and by adding a phase shift circuit. Furthermore, it is possible to incorporate the duplexer into a communication device.

Based on the present invention, it is possible to manufacture a device at low cost and obtain a high yield of a device, by simplifying a manufacturing process and reducing consumption of masks, resist and the like. Further, it is possible to create a high-Q piezoelectric resonator and consequently realize a low-loss piezoelectric filter and a low-loss duplexer.

Figure 1A:
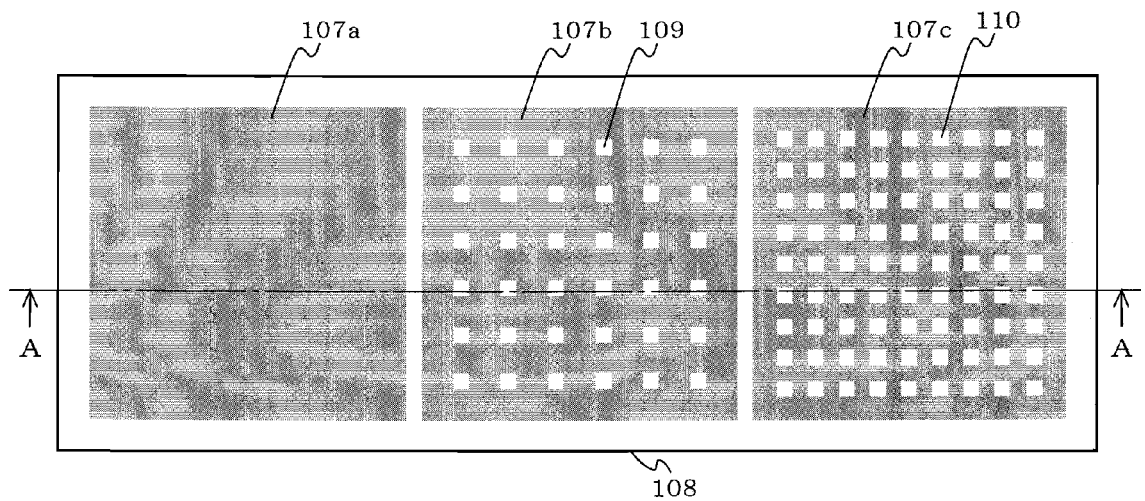
FIG. 1A is a top view of a piezoelectric resonator according to a first embodiment of the present invention.

DESCRIPTION OF THE REFERENCE CHARACTERS 101, 1103 substrate
102a-102c, 502b, 502c, 602b, 602c, 802, 803a, 803b, 804, 1101, 1102, 1201 piezoelectric resonator
103a-103c, 1104, 1105 cavity
104a-104c, 1106 lower electrode layer
105a-105c, 1107 piezoelectric layer
106a-106c, 1108, 1208 upper electrode layer
107a-107c, 507b, 507c, 607b, 607c frequency adjustment layer
108, 608 insulating layer
109, 110, 509, 510, 609, 610 depression
805a, 805b inductor
904, 906, 1004, 1006 filter
905 phase shift circuit
1002 baseband section
1003 power amplifier (PA)
1005 antenna
1007 LNA

DETAILED DESCRIPTION OF THE INVENTION

With reference to the drawings, embodiments of the present invention will be described below.

First Embodiment

Figure 1B:
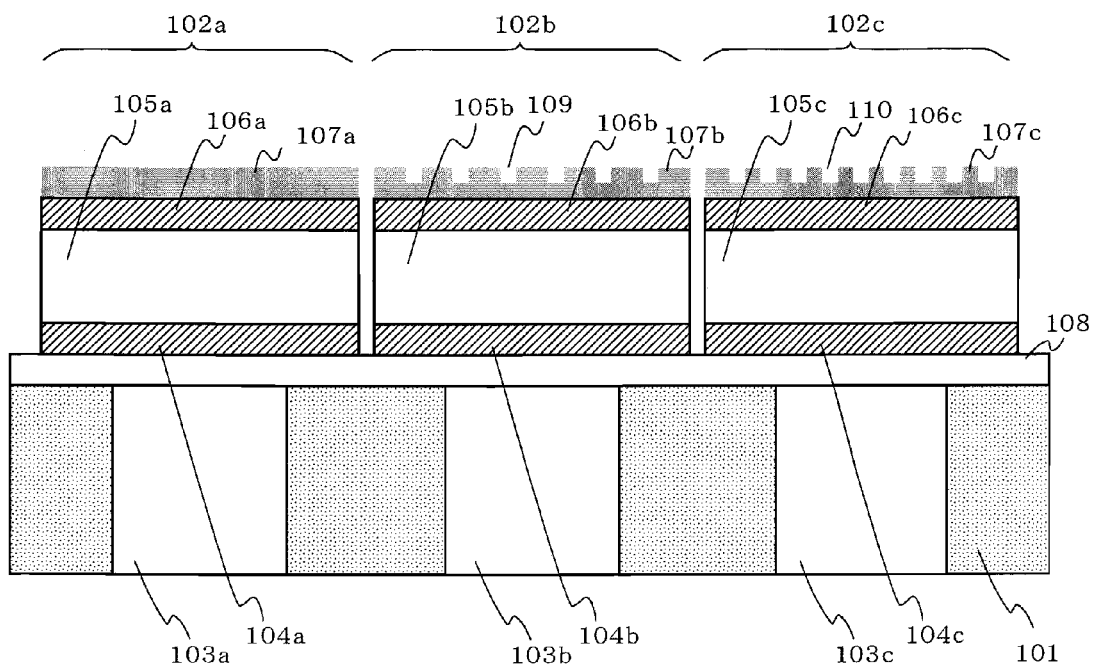
FIG. 1B is a cross-sectional view of the piezoelectric resonator according to the first embodiment of the present invention.

FIG. 1A is a top view of a piezoelectric resonator according to a first embodiment of the present invention. FIG. 1B is an A-A cross-sectional view of the piezoelectric resonator, shown in FIG. 1A, according to the first embodiment of the present invention.

In FIGS. 1A and 1B, the piezoelectric resonator device according to the first embodiment includes three piezoelectric resonators 102a through 102c. A first piezoelectric resonator 102a includes a substrate 101, a first cavity 103a, an insulating layer 108, a first lower electrode layer 104a, a first piezoelectric layer 105a, a first upper electrode layer 106a, and a first frequency adjustment layer 107a. A second piezoelectric resonator 102b includes the substrate 101, a second cavity 103b, the insulating layer 108, a second lower electrode layer 104b, a second piezoelectric layer 105b, a second upper electrode layer 106b, and a second frequency adjustment layer 107b. A third piezoelectric resonator 102c includes the substrate 101, a third cavity 103c, the insulating layer 108, a third lower electrode layer 104c, a third piezoelectric layer 105c, a third upper electrode layer 106c, and a third frequency adjustment layer 107c. The second frequency adjustment layer 107b includes a plurality of depressions 109. Further, the third frequency adjustment layer 107c includes a plurality of depressions 110.

On the substrate 101 made of silicon, glass or the like and providing therein the first through third cavities 103a through 103c which are hollow spaces, the insulating layer 108 made of silicon dioxide ($SiO_2$), silicon nitride ($Si_3N_4$) or the like is formed. On the insulating layer 108, the first through third lower electrode layers 104a through 104c made of molybdenum (Mo), aluminum (Al), silver (Ag), tungsten (W), platinum (Pt) or the like are formed so as to correspond to the first through third cavities 103a through 103c, respectively. On the first through third lower electrode layers 104a through 104c, the first through third piezoelectric layers 105a through 105c made of aluminum nitride (AlN), zinc oxide (ZnO), lead zirconate titanate (PZT), lithium niobate ($LiNbO_3$), lithium tantalate ($LiTaO_3$), potassium niobate ($KNbO_3$) or the like are formed, respectively. On the first through third piezoelectric layers 105a through 105c, the first through third upper electrode layers 106a through 106c made of molybdenum, aluminum, silver, tungsten, platinum or the like are formed, respectively. On the first through third upper electrode layers 106a through 106c, the first through third frequency adjustment layers 107a through 107c made of silicon dioxide, silicon nitride, aluminum nitride, zinc oxide or the like are formed, respectively.

In the first through third piezoelectric resonators 102a through 102c: the first through third lower electrode layers 104a through 104c have the same film thickness structures; the first through third piezoelectric layers 105a through 105c have the same film thickness structures; and the first through third upper electrode layers 106a through 106c have the same film thickness structures. Only the shapes of the first through third frequency adjustment layers 107a through 107c are different from one another. In the first frequency adjustment layer 107a of the first piezoelectric resonator 102a, depression portions to be formed by a photolithography technique and the like are not formed. In contrast, in the second frequency adjustment layer 107b of the second piezoelectric resonator 102b and the third frequency adjustment layer 107c of the third piezoelectric resonator 102c, the depressions 109 and 110 are formed, respectively, by the photolithography technique and the like. In this example, the depressions 109 and 110 are formed such that the density (mass per unit volume) of the second frequency adjustment layer 107b is higher than that of the third frequency adjustment layer 107c. Note that the shapes of the first through third frequency adjustment layers 107a through 107c are not limited to the quadrangles in outline as shown in FIG. 1A.

The first through third piezoelectric resonators 102a through 102c function as a resonator by applying electrical fields between the first through third upper electrode layers 106a through 106c and the first through third lower electrode layers 104a through 104c, respectively, thereby polarizing and distorting the first through third piezoelectric layers 105a through 105c so as to produce mechanical resonance, and by electrically extracting the mechanical resonance. The resonance frequencies of the first through third piezoelectric resonators 102a through 102c are mainly determined based on the film thicknesses and the mass loading effects of respective vibration sections each including a respective one of the first through third lower electrode layers 104a through 104c, a respective one of the first through third piezoelectric layers 105a through 105c, a respective one of the first through third upper electrode layers 106a through 106c. Each piezoelectric resonator also includes a respective one of the first through third frequency adjustment layers 107a through 107c. The mass of the first frequency adjustment layer 107a, that of the second frequency adjustment layer 107b, and that of the third frequency adjustment layer 107c may be different from one another, since the ratio of layer area to depression area varies among the first frequency adjustment layer 107a, the second frequency adjustment layer 107b, and the third frequency adjustment layer 107c. As a result, it is possible to realize three piezoelectric resonators having resonance frequencies different from one another on the same substrate in such a manner that the resonance frequency becomes higher in order starting from the first piezoelectric resonator 102a to the second piezoelectric resonator 102b to the third piezoelectric resonator 102c.

Ordinarily, the photolithography technique for forming depressions in each of the frequency adjustment layers designs a mask corresponding to a portion to be removed or a portion to be left and sequentially performs a process of resist coating, exposure using the mask, development, etching, and resist removal. However, it is possible to form a resonator having not only three types but also a great variety of resonance frequencies by, as in the present invention, varying the ratio of layer area to depression area among the frequency adjustment layers of the piezoelectric resonators to be differentiated in frequency, that is, varying the proportion of mask area among the piezoelectric resonators. Thus, it is possible to simplify a process, improve a yield, and manufacture a device at lower cost.

As described above, based on the piezoelectric resonator according to the first embodiment of the present invention, it is possible to manufacture a piezoelectric resonator device at low cost and obtain a high yield of a device, by simplifying a manufacturing process and reducing consumption of masks, resist and the like. Further, it is possible to realize a high-Q piezoelectric resonator and consequently realize a low-loss piezoelectric filter and a low-loss duplexer.

Note that although in the first embodiment, described is a case where the first through third cavities 103a through 103c are penetration cavities penetrating the substrate 101, the first through third cavities 103a through 103c may be non-penetration cavities using a sacrificial layer. Further, it is also possible to obtain a similar effect by providing under the vibration sections an acoustic mirror layer alternately positioning therein high impedance layers and low impedance layers each having a one-fourth wavelength thickness, instead of using the cavities provided in the substrate 101.

Figure 2:
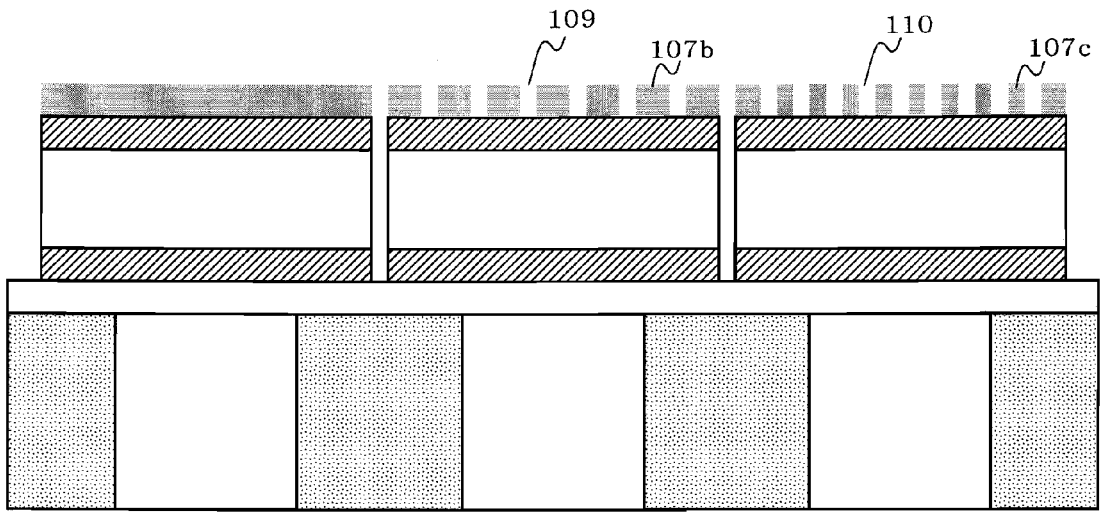
FIG. 2 is another cross-sectional view of the piezoelectric resonator according to the first embodiment of the present invention.
Figure 3A:
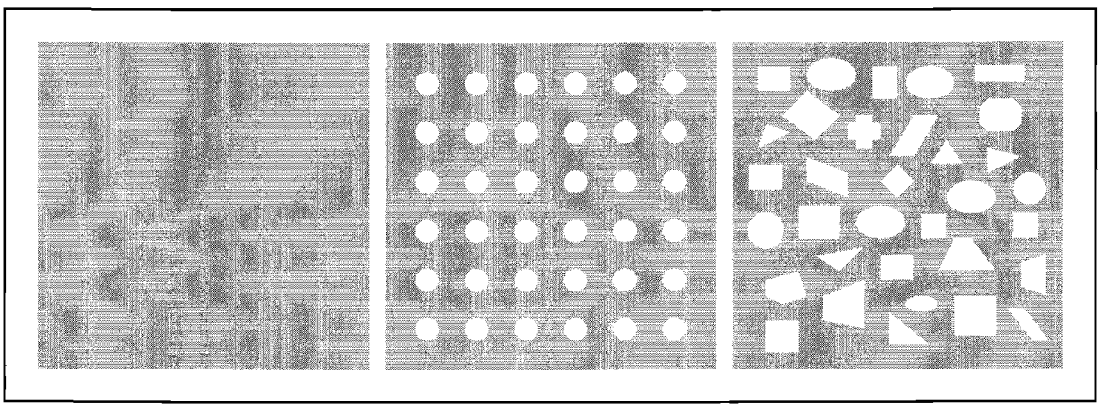
FIG. 3A is another top view of the piezoelectric resonator according to the first embodiment of the present invention.
Figure 3B:
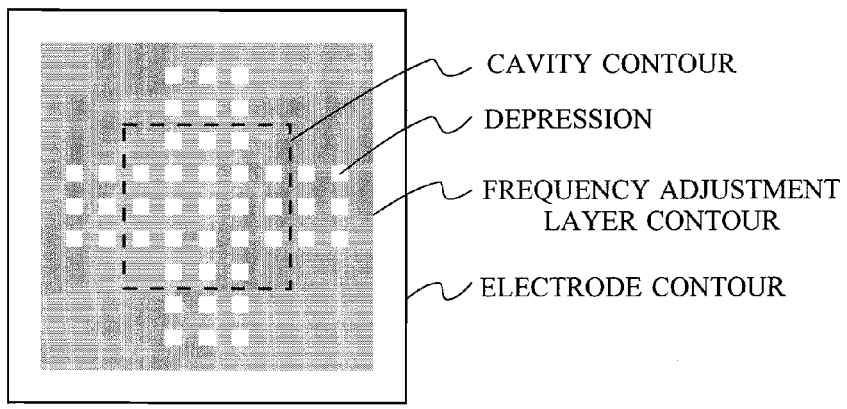
FIG. 3B is another top view of the piezoelectric resonator according to the first embodiment of the present invention.
Figure 4:
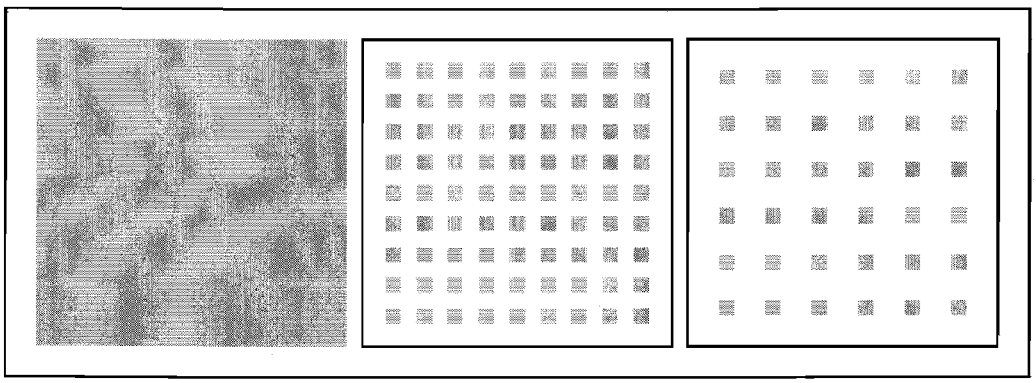
FIG. 4 is another top view of the piezoelectric resonator according to the first embodiment of the present invention.

Note that although in the first embodiment, described in a case where the depressions 109 and 110 are shaped so as not to penetrate the first through third frequency adjustment layers 107a through 107c, the depressions 109 and 110 may be shaped so as to penetrate the first through third frequency adjustment layers 107a through 107c as shown in FIG. 2, for example. All of the depressions or some of the depressions may penetrate the layers. Further, although described is a case where the sizes (areas) of the depressions 109 and 110 are the same, the sizes of the depressions 109 and 110 may be variously different from one another. The differences of the sizes of the depressions 109 and 110 may be the differences of the etching depths thereof, and thus it is possible to perform frequency adjustment by differentiating the film thicknesses. Further, although described is a case where the depressions 109 and 110 are quadrangular in outline, the depressions 109 and 110 may be circular, oval, or polygonal in outline as shown in FIG. 3A, for example. Further, the shapes in which the depressions 109 and 110 are formed are not required to conform to the shapes of the frequency adjustment layers. Particularly, it is possible to suppress spurious (unnecessary vibrations) by differentiating the shapes in which the depressions 109 and 110 are formed, from the shapes of the cavities and the electrodes (FIG. 3B). Further, although described is a case where the portions to be the depressions 109 and 110 are removed from the first through third frequency adjustment layers 107a through 107c, the portions corresponding to the depressions 109 and 110 may be left therein as shown in FIG. 4 so as to form "islands". That is, the removed portions may be grid trenches leaving the islands of material on the surface.

Note that although in the first embodiment, described is a case where the depressions 109 and 110 are formed using the first through third frequency adjustment layers 107a through 107c, it is also possible to form depressions directly in the first through third upper electrode layers 106a through 106c without using the first through third frequency adjustment layers 107a through 107c, so as to adjust the resonance frequencies of the first through third piezoelectric resonators 102a through 102c.

Second Embodiment

Figure 5A:
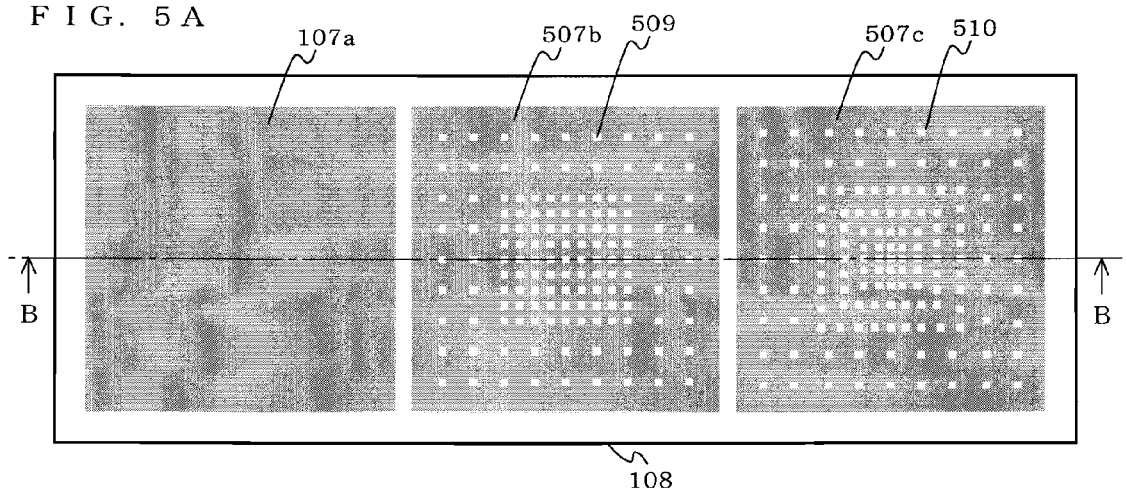
FIG. 5A is a top view of a piezoelectric resonator according to a second embodiment of the present invention.
Figure 5B:
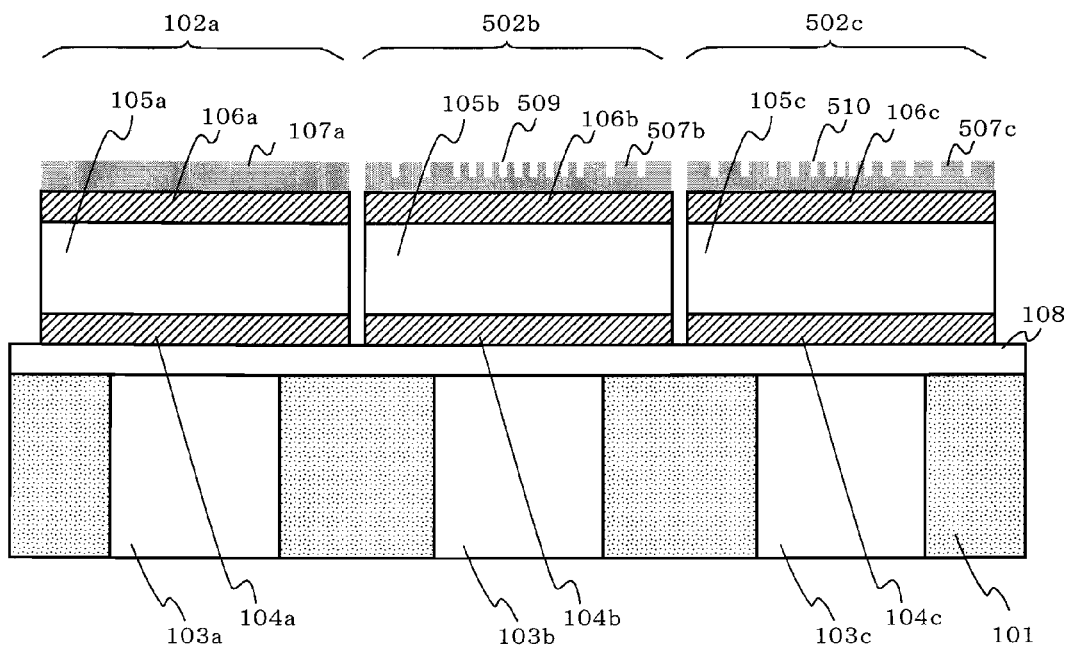
FIG. 5B is a cross-sectional view of the piezoelectric resonator according to the second embodiment of the present invention.

FIG. 5A is a top view of a piezoelectric resonator according to a second embodiment of the present invention. FIG. 5B is a B-B cross-sectional view of the piezoelectric resonator, shown in FIG. 5A, according to the second embodiment of the present invention.

In FIGS. 5A and 5B, the piezoelectric resonator according to the second embodiment includes three piezoelectric resonators 102a, 502b, and 502c. A first piezoelectric resonator device 102a includes a substrate 101, a first cavity 103a, an insulating layer 108, a first lower electrode layer 104a, a first piezoelectric layer 105a, a first upper electrode layer 106a, and a first frequency adjustment layer 107a. A second piezoelectric resonator 502b includes the substrate 101, a second cavity 103b, the insulating layer 108, a second lower electrode layer 104b, a second piezoelectric layer 105b, a second upper electrode layer 106b, and a second frequency adjustment layer 507b. A third piezoelectric resonator 502c includes the substrate 101, a third cavity 103c, the insulating layer 108, a third lower electrode layer 104c, a third piezoelectric layer 105c, a third upper electrode layer 106c, and a third frequency adjustment layer 507c. The second frequency adjustment layer 507b includes a plurality of depressions 509. Further, the third frequency adjustment layer 507c includes a plurality of depressions 510.

As can be seen from the drawings, the piezoelectric resonator according to the second embodiment is different from the piezoelectric resonator according to the first embodiment in that the piezoelectric resonator according to the second embodiment includes the second frequency adjustment layer 507b and the third frequency adjustment layer 507c. These different elements of the piezoelectric resonator according to the second embodiment will be described below.

Figure 6A:
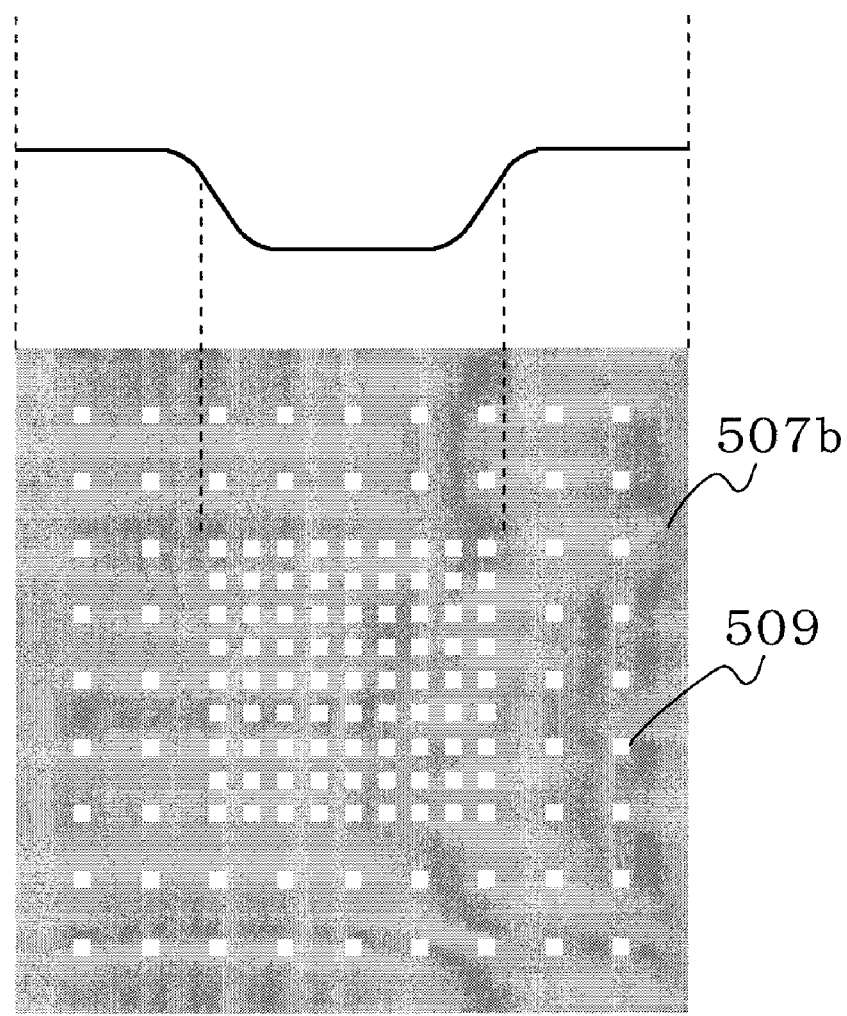
FIG. 6A is a diagram illustrating a feature of the piezoelectric resonator according to the second embodiment of the present invention.
Figure 6B:
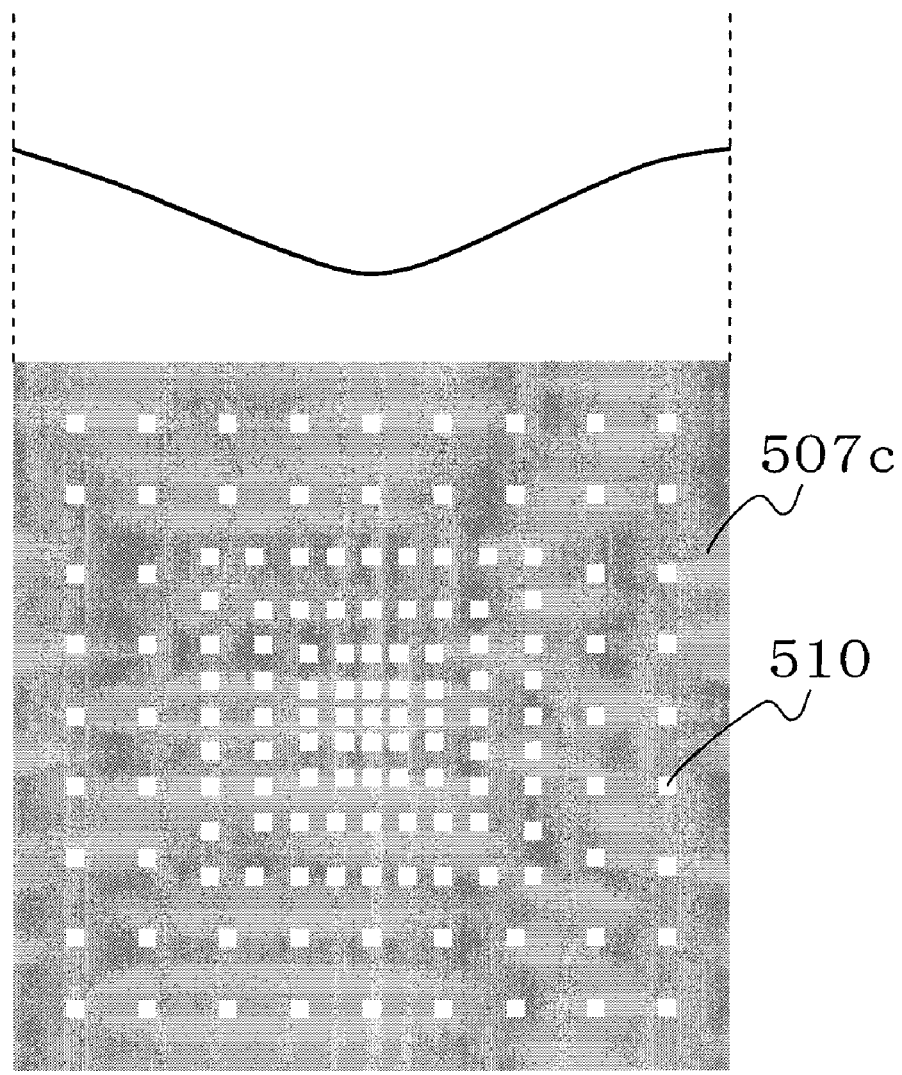
FIG. 6B is a diagram illustrating a feature of the piezoelectric resonator according to the second embodiment of the present invention.
Figure 6C:
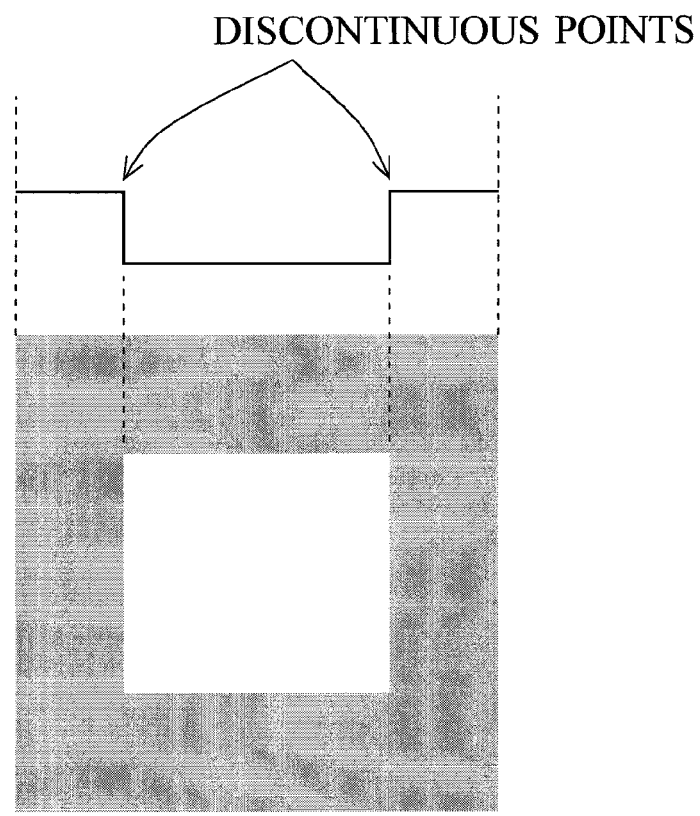
FIG. 6C is a diagram illustrating a problem of a conventional piezoelectric resonator.
Figure 12:
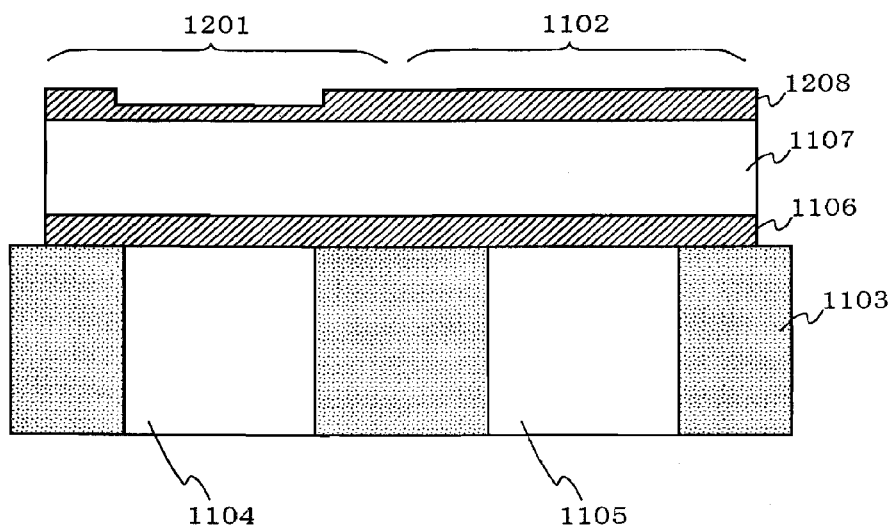
FIG. 12 is another cross-sectional view of the conventional piezoelectric resonator.

The depressions (small-area figures, or shapes, formed by removing adjustment material) 509 provided in the second frequency adjustment layer 507b and the depressions 510 provided in the third frequency adjustment layer 507c are formed such that the density of each of the frequency adjustment layers, that is, the mass per unit volume of the adjustment material not removed, is larger in the peripheral portion than in the central portion. In other words, the interval between the depressions 509 at the peripheral portion is larger than at the central portion. As shown in FIG. 6A, the distribution of mass of the second frequency adjustment layer 507b forms regions, among which the mass per unit volume varies in accordance with the plurality of depressions 509, and thus the distribution of mass has no discontinuous points. Further, as shown in FIG. 6B, the distribution of mass of the third frequency adjustment layer 507c has the plurality of depressions 510 arranged such that the mass per unit volume is incrementally larger moving from the central portion to the peripheral portion, and thus the distribution of mass is so smooth as not to have nay discontinuous points. Note that FIG. 6C is a diagram showing the distribution of mass of a conventional upper electrode layer, shown in FIG. 12, which has discontinuous points.

As described above, based on the piezoelectric resonator according to the second embodiment of the present invention, the depressions are formed in such a shape that in each of the frequency adjustment layers, the mass per unit volume of the adjustment material not removed is smaller in the central portion and larger in the peripheral portion. As a result, the mass loading of each of the piezoelectric resonators may be larger in the peripheral portion than in the central portion, and therefore the energy of elastic waves may be confined to the piezoelectric layers. Thus, it is possible to realize the piezoelectric resonator for obtaining a high Q value, the Q value representing performance. Additionally, acoustic discontinuity within the piezoelectric resonator may be eliminated, and thus it is possible to reduce spurious (unnecessary vibrations).

Figure 7A:
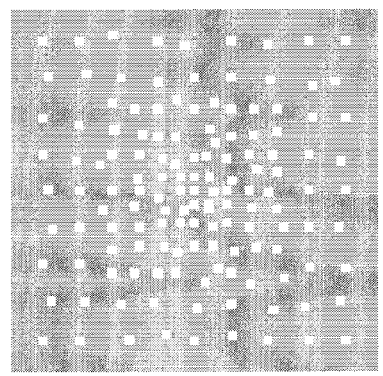
FIG. 7A is another top view of the piezoelectric resonator according to the second embodiment of the present invention.
Figure 7B:
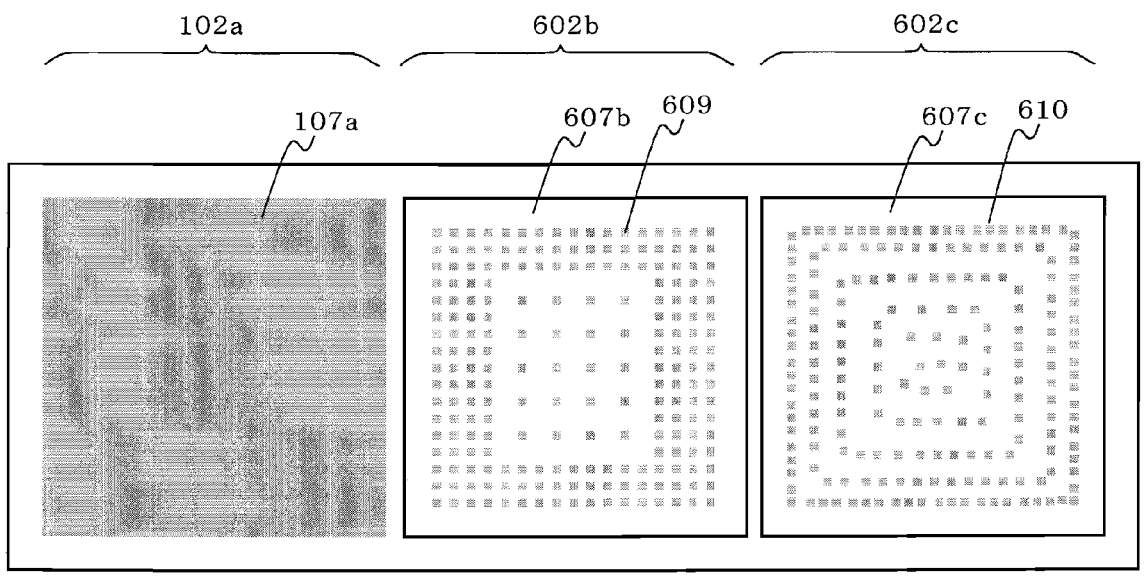
FIG. 7B is another top view of the piezoelectric resonator according to the second embodiment of the present invention.

Note that the depressions formed in each of the frequency adjustment layers may not be required to be regularly arranged so long as the mass per unit volume of the adjustment material not removed is smaller in the central portion and larger in the peripheral portion, and thus may be randomly arranged as shown in FIG. 7A, for example. Alternatively, as shown in FIG. 7B, frequency adjustment layers 607b and 607c may be formed, by removing the adjustment material other than that corresponding to a plurality of small-area figures 609 and 610, in such a shape that in each of the frequency adjustment layers, the mass per unit volume of the adjustment material not removed is larger in the peripheral portion than in the central portion. Thus, it is also possible to obtain a similar effect.

(An Example of a Piezoelectric Filter Using a Piezoelectric Resonator)

Figure 8:
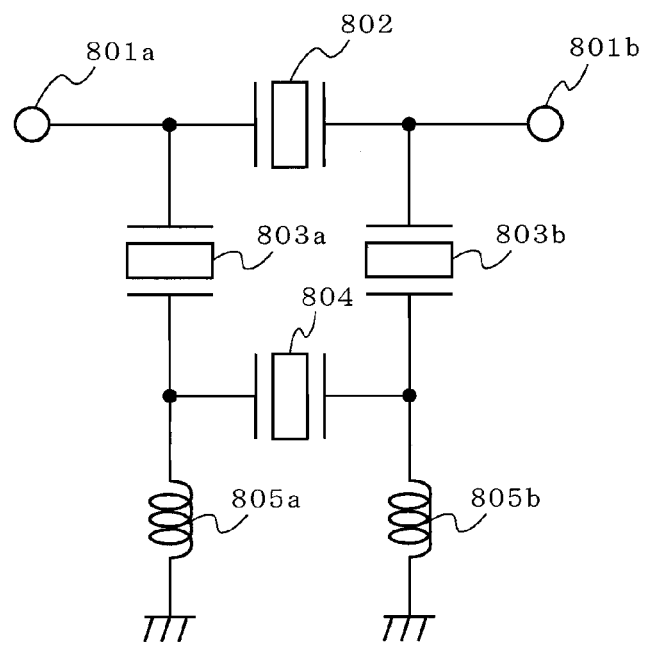
FIG. 8 is a diagram showing an example of a piezoelectric filter using a piezoelectric resonator of the present invention.

FIG. 8 is a circuit diagram showing an example of a piezoelectric filter using a piezoelectric resonator of the present invention. The piezoelectric filter shown in FIG. 8 includes a series piezoelectric resonator 802, parallel piezoelectric resonators 803a and 803b, a bypass piezoelectric resonator 804, and inductors 805a and 805b.

The series piezoelectric resonator 802 is series-connected between an input terminal 801a and an output terminal 801b. One electrode of the parallel piezoelectric resonator 803a is connected to the connection point of the input terminal 801a and the series piezoelectric resonator 802, while the other electrode thereof is connected to one terminal of the inductor 805a. One electrode of the parallel piezoelectric resonator 803b is connected to the connection point of the series piezoelectric resonator 802 and the output terminal 801b, while the other electrode thereof is connected to one terminal of the inductor 805b. The other terminals of the inductors 805a and 805b are grounded. The bypass piezoelectric resonator 804 is connected between the other terminal of the parallel piezoelectric resonator 803a and the other terminal of the parallel piezoelectric resonator 803b.

Although it varies depending on desired filter characteristics, the resonance frequency is, basically, set to become lower in order starting from the series piezoelectric resonator 802 to the parallel piezoelectric resonators 803a and 803b to the bypass piezoelectric resonator 804. The resonance frequencies of the parallel piezoelectric resonator 803a and the parallel piezoelectric resonator 803b are virtually the same. The above-described piezoelectric filter requires three piezoelectric resonators having resonance frequencies different from one another on the same substrate. Therefore, the bypass piezoelectric resonator 804, which has the lowest resonance frequency, may correspond to the first piezoelectric resonator 102a, the parallel piezoelectric resonators 803a and 803b may correspond to the second piezoelectric resonator 102b, and the series piezoelectric resonator 802, which has the highest resonance frequency, may correspond to the third piezoelectric resonator 102c. Thus, it is possible to realize the piezoelectric filter capable of producing useful effects of the present invention.

Note that the circuit structure of the piezoelectric filter is merely an example, and therefore the number of stages is not limited thereto. Further, it is obvious that the present invention is applicable to any piezoelectric filter having three or more resonance frequencies, even when the piezoelectric filter is ladder-shaped or lattice-shaped in an ordinary manner.

(An Example of a Duplexer Using the Piezoelectric Resonator)

Figure 9:
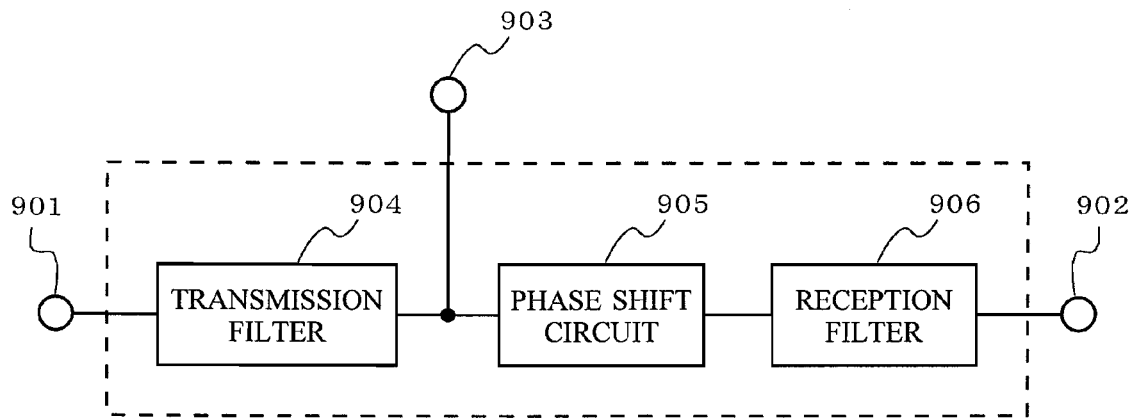
FIG. 9 is a diagram showing an example of a duplexer using the piezoelectric resonator of the present invention.

FIG. 9 is a diagram showing an example structure of a duplexer using the piezoelectric filter shown in FIG. 8. The duplexer includes a transmission filter 904, a reception filter 906, and a phase shift circuit 905. An antenna is connected to a terminal 903. The piezoelectric filter shown in FIG. 8 may be used for at least either one of the transmission filter 904 or the reception filter 906, and thus it is possible to realize the duplexer capable of producing useful effects of the present invention.

(An Example of a Communication Device Using the Piezoelectric Resonator)

Figure 10:
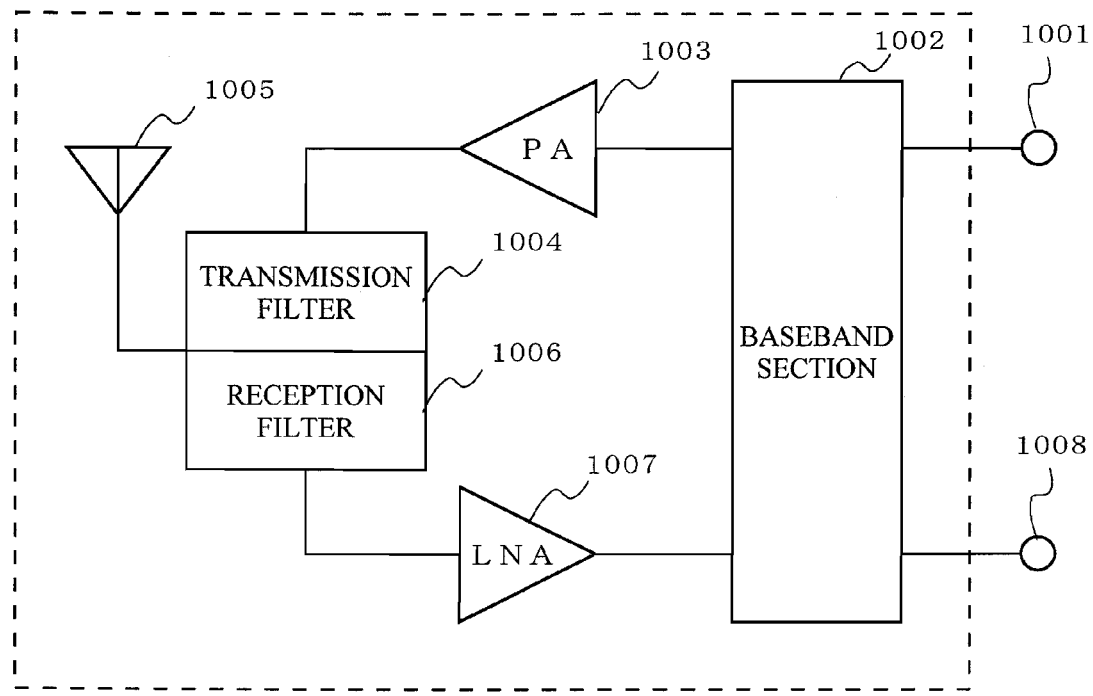
FIG. 10 is a diagram showing a communication device using the piezoelectric resonator of the present invention.
Figure 11:
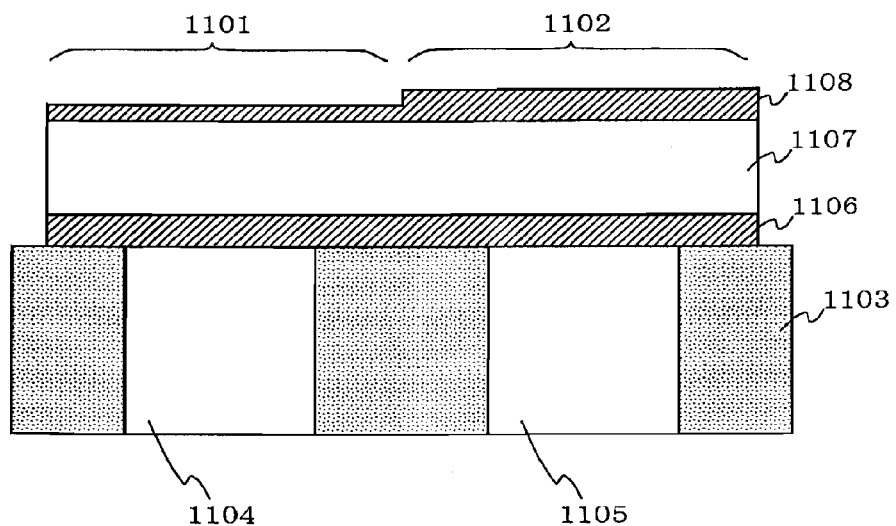
FIG. 11 is a cross-sectional view of a conventional piezoelectric resonator.

FIG. 10 is a diagram showing an example structure of a communication device using the duplexer shown in FIG. 9. The communication device includes a baseband section 1002, a power amplifier (PA) 1003, a transmission filter 1004, an antenna 1005, a reception filter 1006, and an LNA 1007.

A signal inputted to the transmission terminal 1001 passes through the baseband section 1002, is amplified in the power amplifier 1003, and is filtered in the transmission filter 1004, whereby a radio wave thereof is transmitted from the antenna 1005. A signal received by the antenna 1005 is filtered in the reception filter 1006, is amplified in the LNA 1007, passes through the baseband section 1002, and is transmitted to a reception terminal 1008. The duplexer shown in FIG. 9 may be used for the transmission filter 1004 and the reception filter 1006, and thus it is possible to realize the communication device capable of producing useful effects of the present invention.

INDUSTRIAL APPLICABILITY

The piezoelectric resonator device and the piezoelectric filter of the present invention can be realized, being small in size and having low-loss characteristics, at low cost, and therefore are useful for a filter provided within a wireless circuit of a mobile communication terminal such as a mobile phone and a wireless LAN. Further, the piezoelectric resonator and the piezoelectric filter of the present invention are applicable to a filter and the like of a wireless base station, in accordance with specifications.

The invention claimed is:

1. A piezoelectric resonator comprising:
   a substrate;
   a vibration section on said substrate; and
   a frequency adjustment layer on said vibration section, said frequency adjustment layer having a plurality of depressions in which a part of a material of said frequency adjustment layer is removed from an area of said frequency adjustment layer corresponding to a shape of each of said depressions, said depressions being arranged on a surface of said frequency adjustment layer such that an interval between adjacent depressions in a peripheral portion of said frequency adjustment layer is larger than an interval between adjacent depressions in a central portion of said frequency adjustment layer.

2. The piezoelectric resonator of claim 1, wherein the interval between adjacent depressions is incrementally larger in a direction from the central portion of said frequency adjustment layer to the peripheral portion of said frequency adjustment layer.

3. A piezoelectric filter comprising:
   a substrate; and
   at least three piezoelectric resonators connected to said substrate, said at least three piezoelectric resonators comprising:
      a first piezoelectric resonator including a first vibration section and a first frequency adjustment layer on said first vibration section; and
      a second piezoelectric resonator and a third piezoelectric resonator each comprising said piezoelectric resonator of claim 2;
   wherein an average mass of material of said first frequency adjustment layer and an average mass of said material of said frequency adjustment layer of each of said second piezoelectric resonator and said third piezoelectric resonator varies among said first piezoelectric resonator, said second piezoelectric resonator, and said third piezoelectric resonator.

4. A piezoelectric filter comprising:
   a substrate; and
   at least three piezoelectric resonators connected to said substrate, said at least three piezoelectric resonators comprising:
      a first piezoelectric resonator including a first vibration section and a first frequency adjustment layer on said first vibration section; and
      a second piezoelectric resonator and a third piezoelectric resonator each comprising said piezoelectric resonator of claim 1;
   wherein an average mass of material of said first frequency adjustment layer and an average mass of said material of said frequency adjustment layer of each of said second piezoelectric resonator and said third piezoelectric resonator varies among said first piezoelectric resonator, said second piezoelectric resonator, and said third piezoelectric resonator.

5. A duplexer comprising:
   a transmission filter; and
   a reception filter;
   wherein at least one of said transmission filter and said reception filter includes said piezoelectric filter of claim 4.

6. A communication device comprising:
   an antenna;
   a transmission device; and
   a reception device;
   wherein one group of either a first group including a connection portion of said antenna, said transmission device, and said reception device, and a second group including said transmission device and said reception device comprises said duplexer of claim 5.

7. A communication device comprising:
   an antenna;
   a transmission device; and
   a reception device;
   wherein one group of either a first group including a connection portion of said antenna, said transmission device, and said reception device, or a second group including said transmission device and said reception device comprises said piezoelectric filter of claim 4.

8. A piezoelectric resonator comprising:
   a substrate;
   a vibration section on said substrate; and
   a frequency adjustment layer on said vibration section, said frequency adjustment layer having a plurality of islands around which a part of a material of said frequency adjustment layer is removed from an area of said frequency adjustment layer not corresponding to a shape of each of said islands, said islands being arranged on a surface of said frequency adjustment layer such that an interval between adjacent islands in a peripheral portion of said frequency adjustment layer is smaller than an interval between adjacent islands in a central portion of said frequency adjustment layer.

9. The piezoelectric resonator of claim 8, wherein the interval between adjacent islands is incrementally smaller in a direction from the central portion of said frequency adjustment layer to the peripheral portion of said frequency adjustment layer.

10. A piezoelectric filter comprising:
    a substrate; and
    at least three piezoelectric resonators connected to said substrate, said at least three piezoelectric resonators comprising:
       a first piezoelectric resonator including a first vibration section and a first frequency adjustment layer on said first vibration section; and
       a second piezoelectric resonator and a third piezoelectric resonator each comprising said piezoelectric resonator of claim 9;
    wherein an average mass of material of said first frequency adjustment layer and an average mass of said material of said frequency adjustment layer of each of said second piezoelectric resonator and said third piezoelectric resonator varies among said first piezoelectric resonator, said second piezoelectric resonator, and said third piezoelectric resonator.

11. A piezoelectric filter comprising:
a substrate; and
at least three piezoelectric resonators connected to said substrate, said at least three piezoelectric resonators comprising:
  a first piezoelectric resonator including a first vibration section and a first frequency adjustment layer on said first vibration section; and
  a second piezoelectric resonator and a third piezoelectric resonator each comprising said piezoelectric resonator of claim 8;
wherein an average mass of material of said first frequency adjustment layer and an average mass of said material of said frequency adjustment layer of each of said second piezoelectric resonator and said third piezoelectric resonator varies among said first piezoelectric resonator, said second piezoelectric resonator, and said third piezoelectric resonator.

* * * * *